(12) United States Patent
MacNeil

(10) Patent No.: US 7,351,669 B2
(45) Date of Patent: Apr. 1, 2008

(54) METHOD OF FORMING A SUBSTANTIALLY CLOSED VOID

(75) Inventor: John MacNeil, Heath (GB)

(73) Assignee: Aviza Technology Limited, Newport, Gwent (GB)

(*) Notice: Subject to any disclaimer, the term of this patent is extended or adjusted under 35 U.S.C. 154(b) by 275 days.

(21) Appl. No.: 10/923,027

(22) Filed: Aug. 23, 2004

(65) Prior Publication Data
US 2005/0042890 A1    Feb. 24, 2005

Related U.S. Application Data

(60) Provisional application No. 60/513,008, filed on Oct. 22, 2003.

(30) Foreign Application Priority Data
Aug. 22, 2003  (GB) ................... 0319764.7

(51) Int. Cl.
*H01L 21/31* (2006.01)
*H01L 21/469* (2006.01)
(52) U.S. Cl. ............. 438/778; 438/781; 438/798
(58) Field of Classification Search ........ 438/778, 438/781, 782, 798, 780
See application file for complete search history.

(56) References Cited

U.S. PATENT DOCUMENTS

| 5,008,213 | A | * | 4/1991 | Kolesar, Jr. ............... 438/107 |
| 5,763,020 | A | * | 6/1998 | Yang ........................ 427/569 |
| 5,766,982 | A | * | 6/1998 | Akram et al. .............. 438/51 |
| 6,228,756 | B1 | | 5/2001 | Lee |
| 6,531,413 | B2 | * | 3/2003 | Hsieh et al. ............... 438/782 |
| 6,635,363 | B1 | * | 10/2003 | Duclos et al. ............. 428/690 |
| 2003/0042612 | A1 | | 3/2003 | Leuschner et al. |
| 2003/0049914 | A1 | | 3/2003 | Leuschner et al. |

\* cited by examiner

*Primary Examiner*—Fernando L. Toledo
(74) *Attorney, Agent, or Firm*—Volentine & Whitt, PLLC

(57) ABSTRACT

To form a substantially closed void between two structures on a substrate, a flowable liquid dielectric material is deposited to fill partially the space between the structures, and a surface is placed to bridge and substantially close the space between the structures. The substrate is then inverted whilst maintaining the bridge and the deposited material is allowed to flow down to be substantially supported by the surface. The material is set in its substantially supported position, and the surface is removed.

16 Claims, 1 Drawing Sheet

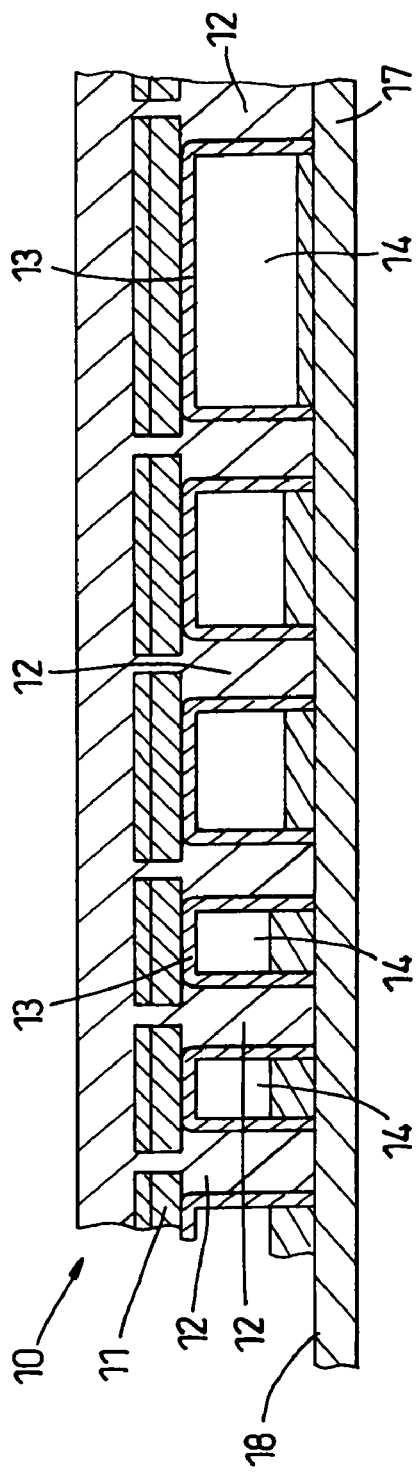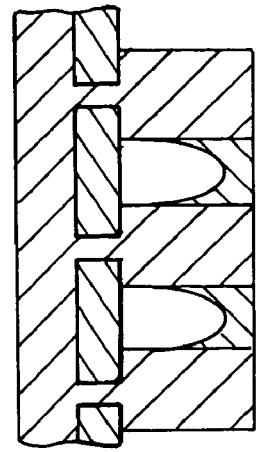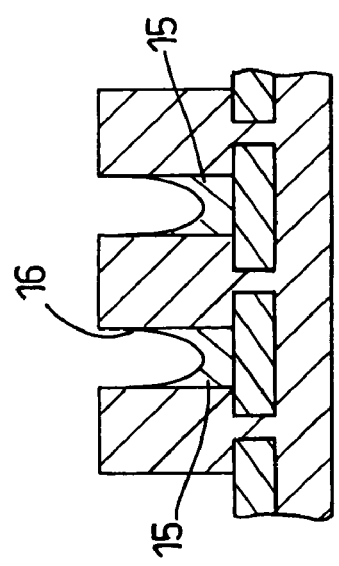

METHOD OF FORMING A SUBSTANTIALLY CLOSED VOID

CROSS-REFERENCE TO RELATED APPLICATION(S)

A claim of priority is made to U.S. provisional application Ser. No. 60/513,008, filed Oct. 22, 2003 and to British patent application no. 0319764.7 filed Aug. 22, 2003.

BACKGROUND OF THE INVENTION

1. Field of the Invention

This invention relates to a method of forming a substantially closed void, for example between two metal lines or structures on a substrate such as a semiconductor wafer.

2. Background of the Invention

It is well known in the semiconductor and nanotechnology industries that as device dimensions become smaller and the metal current carrying lines on such devices accordingly get closer together, problems arising from capacitive coupling between the metal lines increase. Over the past few years, therefore, there has been a drive to produce flowable gap-filling dielectric materials with low dielectric constants. However, it has long been recognised, that a vacuum void is the lowest constant dielectric material that can separate the lines and, for example, U.S. Pat. No. 4,920,639, which was granted back in 1990, discusses a system for achieving such an arrangement, based on the creation of such voids.

Such voids are frequently called "air gaps" in the literature). However, this approach presents its own problems, because a system of support pillars are required for the metal interconnects and the voids either have to be temporarily capped to prevent subsequent deposition filling them or the material in those "voids" has to be removed at the end of the fabrication process.

Another approach is to use non-conformal deposition of a material which does not properly fill small gaps, but this requires subsequent chemical mechanical polishing. Further approaches are shown in U.S. Pat. Nos. 5,324,683 and 6,091,149, but both involve the formation of a finer detail gap to allow the void to be finally bridged and as device manufacturer is close to the physical limits of lithography, the formation of such finer detail becomes impractical.

Similar issues can arise in the formation of semiconductor and dielectric, trenches and membrane structures in MEMS and transducers.

SUMMARY OF THE INVENTION

The present invention consists in a method of forming a substantially closed void between structures on a substrate including:
 (a) depositing a flowable liquid material to fill partially the space between the structures;
 (b) placing a surface to bridge and substantially close the space between the lines;
 (c) inverting the substrate whilst maintaining the bridge and allowing the deposited material to flow down to be substantially supported by the surface;
 (d) setting the material in its substantially supported position and
 (e) removing the surface.

Conveniently the surface is flat and this also avoids the need for subsequent chemical mechanical polishing or the like. The surface is also preferably non-wetting for the flowable material. This may be achieved by the surface being very smooth and/or low friction. It could for example be coated with polytetrafluoroethene.

The material may be set by temperature, infra red (IR) radiation, ultra violet (UV) radiation, radio frequency (RF), radiation or a chemical reaction or a combination thereof. Where the material is set, at least in part, by radiation, the surface is preferably transparent to some degree.

The surface may be formed on any suitable body. For example it may be formed on a substantially rigid wafer or the like. The wafer, may be, for example, sapphire which is UV transparent.

The structures may be metals lines on a semiconductor wafer, the walls of a trench or cavity. Often the flowable material will preferably have a low dielectric constant. Usually there will be plurality of structures. Although the invention has been defined above it is to be understood it includes any inventive combination of the features set out below or in the following description.

BRIEF DESCRIPTION OF THE DRAWINGS

The invention may be performed in various ways and specific embodiments will now be described, by way of example, with reference to the following drawings, in which:

FIG. 1 is a cross-section through part of a semiconductor device, which has been disposed against a surface during the performance of a void forming method;

FIG. 2 illustrates the proceeding step in the method and

FIG. 3 illustrates the result of the performance of the method.

DETAILED DESCRIPTION OF THE PREFERRED EMBODIMENTS

It is well known to form interconnect layers and the like by depositing layers of dielectric and metal on a semiconductor wafer or substrate, in which devices such as transistors and capacitors have been formed. The present embodiment is concerned with creating air gaps or voids between the metal lines.

FIG. 1 illustrates, in its inverted position, such a structure 10 of dielectric material 11, metal lines 12 and barrier layers 13, with air gaps 14 present between the metal lines 12.

As has already been indicated, there are problems in maintaining the air gaps 14 against filling when subsequent layers are deposited and with maintaining mechanical stability. There is also the need for great uniformity across the wafer.

In the applicant's method, as can be seen in FIG. 2, the structure 10 is disposed in a deposition module, such as a chemical vapour deposition module, in its normal upright orientation and an amount of flowable dielectric material is deposited into each air gap 14, as shown at 15 in FIG. 2. The material 15 may be any one of the large number of flowable passivation materials on the market. The applicant's have developed the materials "Flowfill®" and "low k Flowfill®". Other examples of appropriate materials are trade marked HSQ, MSQ or SiLK. The preferred requirements are that the material should be capable of controlled deposition; that it should flow after deposition and that it should not stick significantly to the surfaces onto which it is deposited, whilst it is in a flowable state.

Once the FIG. 2 step is complete, the structure 10 is engaged against some form of anvil, which provides a surface to bridge and close the mouths 16 of the spaces 14.

The anvil and structure 10 are then inverted with the intimate bridging and closing relationship maintained until the position shown in FIG. 1 is achieved. Here the anvil is in the form of a plate 17 having a bridging and closing surface 18. In this position the material 15 then descends under gravity until it extends across the inverted mouths 16 of the air gaps 14 to form those air gaps 14 into closed voids. This is shown schematically in FIG. 1. The material 15 can then be set so as to form a permanent closure of the mouths 16.

Preferably the surface 18 is flat and there will then be no need for chemical mechanical polishing. It is also preferred that the surface 18 is non-wetting to the material 15 so that there is no tendency to pull the plugs of material from the mouths 16.

As illustrated in FIG. 3, the material 15 will actually form a meniscus, prior to setting, so that when the structure 10 is returned to its upright position, for further processing, the plug 15 is in the form of an arch. It will further be understood that as the amount of material 15 can be controlled during deposition, the size of the plugged air gap 14 will be consistent and repeatable. Thus the method provides a system of forming air gaps which are of substantially known dimension, which are closed to allow further deposition steps and which present a flat surface with the metal lines, avoiding the need for chemical mechanical polishing.

It will be appreciated that the amount of material 15 will vary in accordance with the design requirements. The minimum amount of material is that which will close the mouths 16. The less material than can be used, the lower will be the effective dielectric constant of the gap. It will be appreciated that this value is also improved if a low dielectric material is used at 15.

It will further be appreciated that exactly the same approach can be used between dielectric lines and isolation trenches and further to form other sorts of cavities. Thus the material 15 could be used to form a membrane or diaphragm across a cavity. Such membranes could be useful in sensor, where, for example, preferential diffusion is required, whilst diaphragms may be required in small transducers such as microphones or transmitters or micro switches.

What is claimed is:

1. A method of forming a substantially closed void between two structures on a substrate, the two structures defining a space there between, the space including an opening opposite a closed bottom surface, said method comprising:
   (a) depositing a flowable liquid dielectric material to fill partially the space between the structures;
   (b) placing a surface to bridge and substantially close the opening of the space between the structures;
   (c) inverting the substrate whilst maintaining the bridge and allowing the deposited material to flow down to be substantially supported by the surface, wherein a closed void is formed between the material in its substantially supported position and the closed bottom surface of the space between the structures;
   (d) setting the material in its substantially supported position; and
   (e) removing the surface.

2. A method as claimed in claim 1 wherein the surface is flat.

3. A method as claimed in claim 1 wherein the surface is non-wetting for the flowable material.

4. A method as claimed in claim 1 wherein the material is set by temperature, IR radiation, UV radiation, RF radiation or a chemical reaction or a combination thereof.

5. A method as claimed in claim 4 wherein the material is set, at least in part, by radiation and the surface is transparent to that radiation.

6. A method as claimed in claim 1 wherein the surface is formed on a substantially rigid body.

7. A method as claimed in claim 6 wherein the surface is formed on sapphire.

8. A method as claimed in claim 1 wherein the structures are a pair of metal lines or a pair of walls of a trench or cavity or combinations thereof.

9. A method as claimed in claim 2 wherein the surface is non-wetting for the flowable material.

10. A method as claimed in claim 1 wherein the material is set, at least in part, by radiation and the surface is transparent to that radiation.

11. A method as claimed in claim 2 wherein the surface is formed on a substantially rigid body.

12. A method as claimed in claim 2 wherein the surface is formed on sapphire.

13. A method as claimed in claim 9 wherein the surface is formed on a substantially rigid body.

14. A method as claimed in claim 1, wherein the deposited material flows down under force of gravity to be substantially supported by the surface.

15. A method as claimed in claim 1, wherein the closed void is under vacuum.

16. A method as claimed in claim 14, wherein the closed void is under vacuum.

* * * * *